United States Patent
Wei et al.

(10) Patent No.: US 11,114,281 B2
(45) Date of Patent: Sep. 7, 2021

(54) METHOD AND DEVICE FOR RADIO FREQUENCY IMPEDANCE MATCHING, AND SEMICONDUCTOR PROCESSING APPARATUS

(71) Applicant: BEIJING NAURA MICROELECTRONICS EQUIPMENT CO., LTD., Beijing (CN)

(72) Inventors: Gang Wei, Beijing (CN); Jing Wei, Beijing (CN); Jing Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/080,632

(22) Filed: Oct. 26, 2020

(65) Prior Publication Data

US 2021/0098235 A1 Apr. 1, 2021

Related U.S. Application Data

(63) Continuation of application No. PCT/CN2019/083882, filed on Apr. 23, 2019.

(30) Foreign Application Priority Data

Apr. 27, 2018 (CN) .......................... 201810392841.X

(51) Int. Cl.
*H01J 37/32* (2006.01)
(52) U.S. Cl.
CPC ...... *H01J 37/32183* (2013.01); *H01J 37/321* (2013.01); *H01J 37/32091* (2013.01); *H01J 37/32155* (2013.01)

(58) Field of Classification Search
CPC .......... H01J 37/32183; H01J 37/32091; H01J 37/321; H01J 37/32155
See application file for complete search history.

(56) References Cited

U.S. PATENT DOCUMENTS

| 2018/0261430 A1* | 9/2018 | Kawasaki | ......... H01J 37/32935 |
| 2019/0148114 A1* | 5/2019 | Wu | ...................... H01J 37/321 |
| | | | 156/345.48 |

FOREIGN PATENT DOCUMENTS

| CN | 103456591 A | 12/2013 |
| CN | 103650645 A | 3/2014 |

(Continued)

OTHER PUBLICATIONS

World Intellectual Property Organization (WIPO) International Search Report and Written Opinion for PCT/CN2019/083882 dated Jul. 1, 2019 5 Pages.

*Primary Examiner* — Henry Luong
(74) *Attorney, Agent, or Firm* — Anova Law Group, PLLC

(57) ABSTRACT

A method for radio frequency impedance matching includes performing frequency scanning matching using first n pulse phases of first m pulse periods as a frequency scanning stage, and from an (m+1)-th pulse period to an M-th pulse period, maintaining a frequency scanning parameter of a pulse phase corresponding to each frequency scanning stage of each pulse period. The radio frequency includes M pulse periods, each pulse period includes N pulse phases, M and N are integers greater than 1, m and n are integers greater than 0, m<M, n≤N, and i=1, 2, . . . , m. A start value of the frequency scanning parameter of each frequency scanning stage of an (i+1)-th pulse period is consistent with an end value of the frequency scanning parameter of each frequency scanning stage of the i-th pulse period. Accordingly, an end value of the frequency scanning parameter of each (Continued)

frequency scanning stage of an m-th pulse period matches a preset target value of the frequency scanning parameter.

11 Claims, 7 Drawing Sheets

(56) References Cited

FOREIGN PATENT DOCUMENTS

| | | |
|---|---|---|
| CN | 103928283 A | 7/2014 |
| CN | 107887247 A | 4/2018 |
| TW | 201713171 A | 4/2017 |

* cited by examiner

From an (m+1)-th pulse period to an M-th pulse period, the frequency scanning parameter of the pulse phase corresponding to each frequency scanning stage of each pulse period remains unchanged and is consistent with the end value of the frequency scanning parameter of each frequency scanning stage in the m-th pulse period

S120

METHOD AND DEVICE FOR RADIO
FREQUENCY IMPEDANCE MATCHING,
AND SEMICONDUCTOR PROCESSING
APPARATUS

CROSS-REFERENCE TO RELATED APPLICATION

This application is a continuation of PCT Application No. PCT/CN2019/083882, filed on Apr. 23, 2019, which claims priority to the Chinese Applications No. 201810392841.X filed on Apr. 27, 2018, the entire content of which is incorporated herein by reference.

TECHNICAL FIELD

The present disclosure relates to the technical field of semiconductor apparatus, in particular to a method for radio frequency impedance matching, a device for radio frequency impedance matching, and a semiconductor processing apparatus including the device for radio frequency impedance matching.

BACKGROUND

Different types of plasma apparatus have been used in traditional semiconductor manufacturing processes, such as, capacitively coupled plasma (CCP) apparatus, inductively coupled plasma (hereinafter referred to as "ICP") apparatus, and electron cyclotron resonance (ECR) apparatus, etc.

In recent years, as wafer size increasing from 200 mm to 300 mm, it has become very important to increase a plasma ignition window range, improve uniformity of the wafer processing process, and maintain a high plasma density. To ensure that a pulsed plasma can be ignited smoothly, a certain degree of power overshoot is required at the moment when the pulse is started. For this reason, the method implemented in the existing technology is to add an overshoot process during the pulse starting stage, and to ensure a successful ignition of the pulse plasma by using a higher pulse overshoot power.

However, according to the impedance characteristics of the pulsed plasma at the moment of its ignition breakdown, it is necessary to load a higher pulse overshoot power and a longer pulse overshoot time to successfully pulse ignition. In some cases, even if the loaded overshoot power is high and the overshoot time is long, it can be still difficult to pulse ignition successfully.

SUMMARY

According to one aspect of the present disclosure, A method for radio frequency (RF) impedance matching is provided. The radio frequency includes M pulse periods, and each pulse period includes N pulse phases. M and N are integers greater than 1. The method includes performing frequency scanning matching by using first n pulse phases of first m pulse periods as a frequency scanning stage and from an (m+1)-th pulse period to an M-th pulse period, maintaining a frequency scanning parameter of a pulse phase corresponding to each frequency scanning stage of each pulse period to be unchanged. A start value of the frequency scanning parameter of each frequency scanning stage of an (i+1)-th pulse period is consistent with an end value of the frequency scanning parameter of each frequency scanning stage of the i-th pulse period to make an end value of the frequency scanning parameter of each frequency scanning stage of an m-th pulse period to match a preset target value of the frequency scanning parameter. m and n are integers greater than 0, m<M, n≤N, and i=1, 2, ..., m. The frequency scanning parameter of the pulse phase corresponding to each frequency scanning stage of each pulse period is consistent with the end value of the frequency scanning parameter of each frequency scanning stage of the m-th pulse period.

According to another aspect of the present disclosure, a device for RF impedance matching is provided. The device implements a method for RF impedance matching, the radio frequency includes M pulse periods, and each pulse period includes N pulse phases. M and N are integers greater than 1. The method includes performing frequency scanning matching by using first n pulse phases of first m pulse periods as a frequency scanning stage and from an (m+1)-th pulse period to an M-th pulse period, maintaining a frequency scanning parameter of a pulse phase corresponding to each frequency scanning stage of each pulse period to be unchanged. A start value of the frequency scanning parameter of each frequency scanning stage of an (i+1)-th pulse period is consistent with an end value of the frequency scanning parameter of each frequency scanning stage of the i-th pulse period to make an end value of the frequency scanning parameter of each frequency scanning stage of an m-th pulse period to match a preset target value of the frequency scanning parameter. m and n are integers greater than 0, m<M, n≤N, and i=1, 2, ..., m. The frequency scanning parameter of the pulse phase corresponding to each frequency scanning stage of each pulse period is consistent with the end value of the frequency scanning parameter of each frequency scanning stage of the m-th pulse period.

According to further aspect of the present disclosure, a semiconductor processing apparatus is provided. The semiconductor processing apparatus includes a device for RF frequency impedance matching. The device implements a method for RF impedance matching. The radio frequency includes M pulse periods, each pulse periods includes N pulse phases. M and N are integers greater than 1. The method includes performing frequency scanning matching by using first n pulse phases of first m pulse periods as a frequency scanning stage and from an (m+1)-th pulse period to an M-th pulse period, maintaining a frequency scanning parameter of a pulse phase corresponding to each frequency scanning stage of each pulse period to be unchanged. A start value of the frequency scanning parameter of each frequency scanning stage of an (i+1)-th pulse period is consistent with an end value of the frequency scanning parameter of each frequency scanning stage of the i-th pulse period to make an end value of the frequency scanning parameter of each frequency scanning stage of an m-th pulse period to match a preset target value of the frequency scanning parameter. m and n are integers greater than 0, m<M, N, and i=1, 2, ..., m. The frequency scanning parameter of the pulse phase corresponding to each frequency scanning stage of each pulse period is consistent with the end value of the frequency scanning parameter of each frequency scanning stage of the m-th pulse period.

BRIEF DESCRIPTION OF THE DRAWINGS

The accompanying drawings are used to provide a further understanding of the disclosure, constitute a part of the specification, and explain the disclosure in conjunction with the following specific embodiments, but do not constitute a limitation to the disclosure. In the following drawings.

REFERENCE NUMERALS

100: device for RF impedance matching; 110: acquisition module; 120: determination module; and 130: control module.

DETAILED DESCRIPTION

The specific embodiments of the present disclosure will be described in detail below with reference to the accompanying drawings. It should be understood that the specific embodiments described here are only used to illustrate and explain the disclosure and are not used to limit the disclosure.

Figure 1:
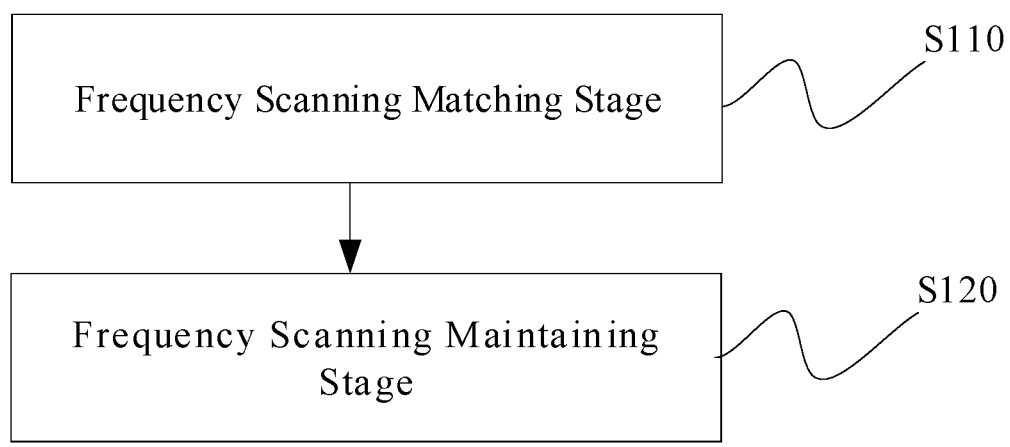
FIG. 1 is a general flowchart of a method for radio frequency (RF) impedance matching according to an embodiment of the present disclosure.

The first aspect of the present disclosure relates to a method for radio frequency (RF) impedance matching. The RF includes M pulse periods, each pulse period includes N pulse phases, and M and N are both integers greater than 1. As shown in FIG. 1, the method for RF impedance matching includes the following steps:

S110: Frequency scanning matching stage.

S120: Frequency scanning maintaining stage.

In S110, first n pulse phases of first m pulse periods may be used as a frequency scanning stage for frequency scanning matching, and a start value of a frequency scanning parameter of each frequency scanning stage of an (i+1)-th pulse period is consistent with an end value of the frequency scanning parameter of each frequency scanning stage of an i-th pulse period, so that the end value of the frequency scanning parameter of each frequency scanning stage of an m-th pulse period can match a preset target value of the frequency scanning parameter. m and n are both integers greater than 0, and m<M, n≤N; i=1, 2, . . . , m.

The above S110 will be described in detail by taking an exemplary example in which n=1 and the frequency scanning stage is called stage z. In S110, frequency scanning matching is performed for each z-stage of the first m pulse periods, and the start value of the frequency scanning parameter of each frequency scanning stage of the (i+1)-th pulse period is consistent with the end value of the frequency scanning parameter of each frequency scanning frequency of the i-th pulse period. Specifically, after the frequency scanning matching of the stage z of the first pulse period is completed, the end value of the frequency scanning parameter of the stage z of the first pulse can be used as the start value of the frequency scanning parameter for the frequency scanning matching of the stage z of the second pulse period, and so on. After the z-stage frequency scanning matching of the m-th pulse period is completed, the end value of the frequency scanning parameter matches a preset target value of the frequency scanning parameter; that is, an output impedance of the RF power supply matches a load impedance.

The above-mentioned value m may be a preset empirical value or may also be a variable. The so-called variable means that the value m is not pre-set, but may be obtained in real-time after the frequency scanning matching of the stage z of each pulse period is completed, and by determining whether the end value of the frequency scanning parameter of the stage z of each pulse period matches a target value of the frequency scanning parameter, and according to a matching result, determining whether to continue the frequency scanning matching on the stage z of a subsequent pulse period or to proceed to S120, that is, determining the value m.

Figure 2:
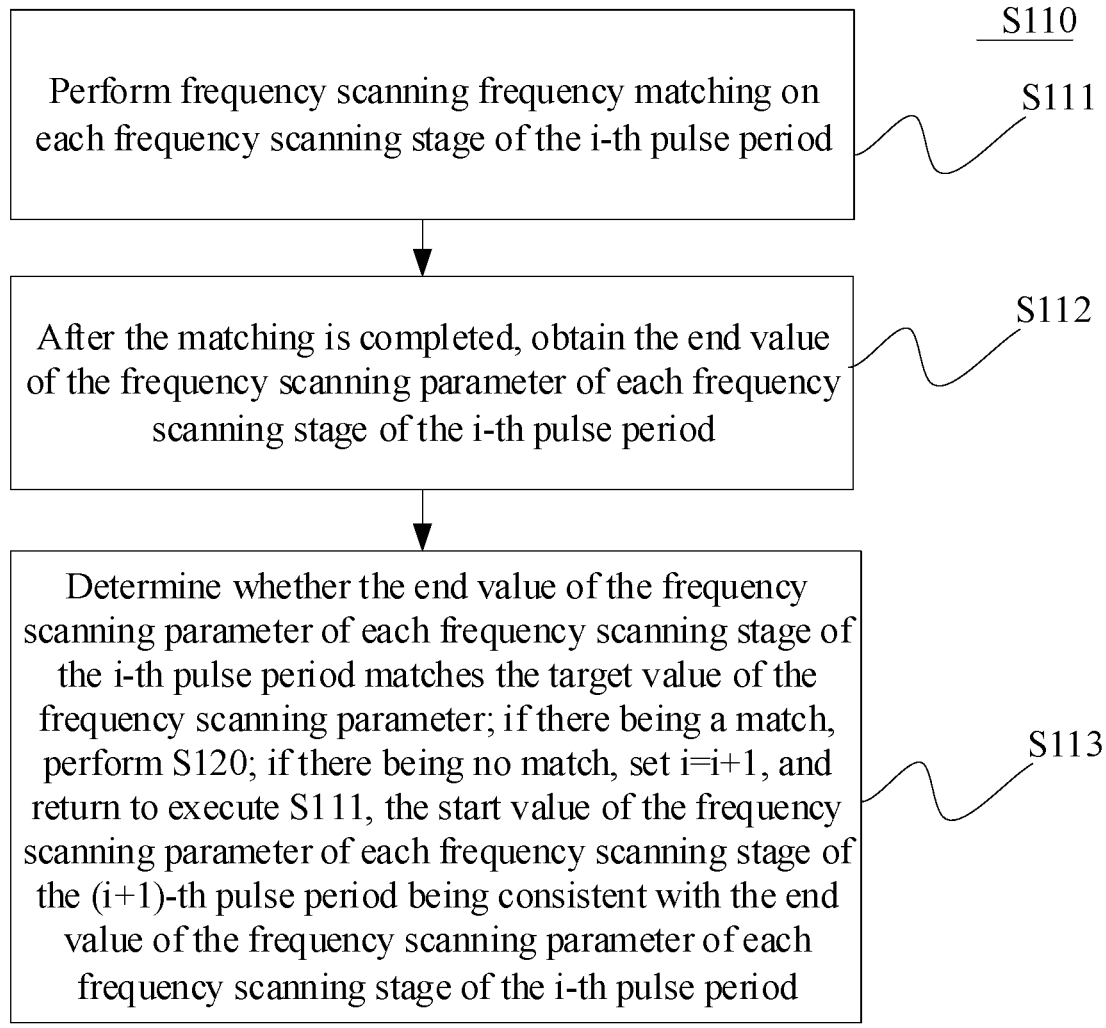
FIG. 2 is a flowchart of S110 of the method for RF impedance matching according to an embodiment of the present disclosure.

Specifically, for the case where the value m is not preset, as shown in FIG. 2, the above S110 may further include:

S111: Performing frequency scanning frequency matching on each frequency scanning stage of the i-th pulse period.

S112: After the matching is completed, obtaining the end value of the frequency scanning parameter of each frequency scanning stage of the i-th pulse period.

S113: Determining whether the end value of the frequency scanning parameter of each frequency scanning stage of the i-th pulse period matches the target value of the frequency scanning parameter; if there is a match, performing S120; if there is no match, setting i=i+1, and returning to execute S111, the start value of the frequency scanning parameter of each frequency scanning stage of the (i+1)-th pulse period being consistent with the end value of the frequency scanning parameter of each frequency scanning stage of the i-th pulse period.

It can be easy to appreciate that in S113, if the end value of the frequency scanning parameter of each frequency scanning stage of the i-th pulse period matches the target value of the frequency scanning parameter, the value of i at this time may be m.

In some embodiments, the above S112 may further include: obtaining a reflected power of the RF power supply at the end of each frequency scanning stage of the i-th pulse period; and determining whether the reflected power matches a predetermined reflected power; if there is a match, determining that the end value of the frequency scanning parameter matches the target value of the frequency scanning parameter; and if there is no match, determining that the end value of the frequency scanning parameter does not match the target value of the frequency scanning parameter.

In some embodiments, the specific type of the aforementioned frequency scanning parameter is not limited. For example, the frequency scanning parameter may be one of: a frequency of the frequency scanning, a frequency scanning range, a frequency scanning speed, a frequency scanning accuracy, or a frequency scanning gain.

Figure 3:
FIG. 3 is a flowchart of S120 of the method for RF impedance matching according to an embodiment of the present disclosure.

After the first m pulse periods, the matching of the output impedance of the RF power supply and the load impedance may be completed, and the above S120 may be performed to the subsequent pulse period. As shown in FIG. 3, in the above S120, from an (m+1)-th pulse period to an M-th pulse period, the frequency scanning parameter of the pulse phase corresponding to each frequency scanning stage of each pulse period remains unchanged and is consistent with the end value of the frequency scanning parameter of each frequency scanning stage in the m-th pulse period.

For example, n=1, and the frequency scanning stage is called stage z, after the frequency scanning matching of the stage z of the m-th pulse period is completed, the end value of the frequency scanning parameter can be used as a frequency scanning parameter of a stage z' of all subsequent pulse periods corresponding to stage z, and the frequency scanning parameter of the pulse phase z' can remain unchanged.

In some embodiments, during the process from the (m+1)-th pulse period to the M-th pulse period, if the actual matching of any pulse period does not meet the matching requirement, fine adjustment of the frequency scanning can also be performed. Specifically, when the frequency scanning frequency matching of the stage z of the m-th pulse period ends, the end value of the frequency scanning parameter can be used as the start value of the frequency scanning parameter for performing frequency scanning matching to each pulse phase z' of the subsequent m' pulse periods. The frequency scanning matching method is the same as the frequency scanning matching method in S110. That is, the start value of the frequency scanning parameter of each frequency scanning stage of the (i+1)-th pulse period is consistent with the end value of the frequency scanning parameter of each frequency scanning stage of the i-th pulse period until the end value of the frequency scanning parameter of each pulse phase z' of the m'-th pulse period matches the preset target value of the frequency scanning parameter.

Figure 4:
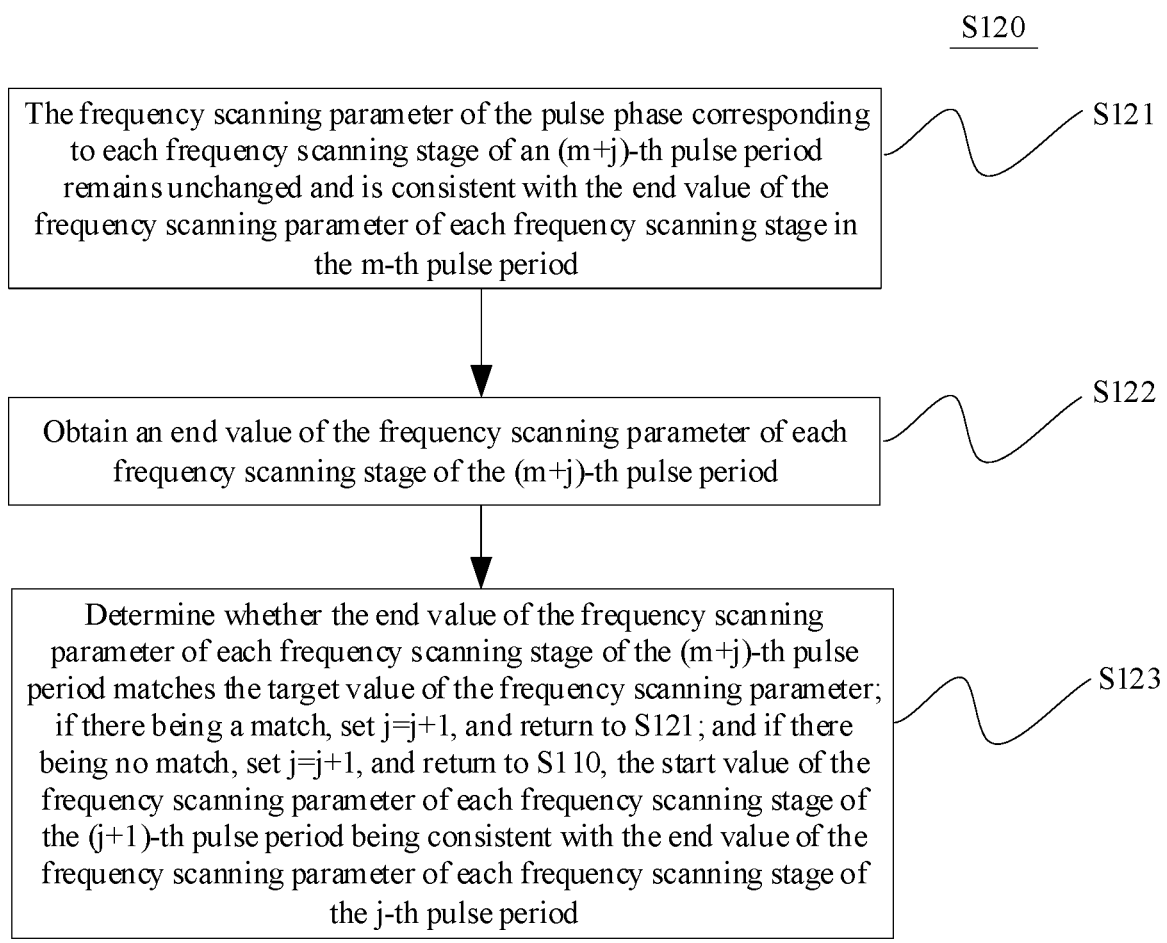
FIG. 4 is another flowchart of S120 of the method for RF impedance matching according to an embodiment of the present disclosure.

Similar to the above-mentioned S110, the foregoing numerical value m' may be a preset empirical value or may also be a variable. For the case where the value m' is not preset, as shown in FIG. 4, S120 may further include:

S121: The frequency scanning parameter of the pulse phase corresponding to each frequency scanning stage of an (m+j)-th pulse period remains unchanged and is consistent with the end value of the frequency scanning parameter of each frequency scanning stage in the m-th pulse period. j=1, 2, . . . , M−m−1.

S122: Obtaining an end value of the frequency scanning parameter of each frequency scanning stage of the (m+j)-th pulse period.

S123: Determining whether the end value of the frequency scanning parameter of each frequency scanning stage of the (m+j)-th pulse period matches the target value of the frequency scanning parameter; if there is a match, setting j=j+1, and returning to S121; and if there is no match, setting j=j+1, and returning to S110, the start value of the frequency scanning parameter of each frequency scanning stage of the (j+1)-th pulse period being consistent with the end value of the frequency scanning parameter of each frequency scanning stage of the j-th pulse period.

In some embodiments, the above S112 may further include: obtaining the reflected power of the RF power supply at the end of each frequency scanning stage of the i-th pulse period; and determining whether the reflected power matches the predetermined reflected power; if there is a match, determining that the end value of the frequency scanning parameter matches the target value of the frequency scanning parameter; and if there is no match, determining that the end value of the frequency scanning parameter does not match the target value of the frequency scanning parameter.

In some embodiments, the reflected power of the predetermined RF power supply may be less than or equal to 80 W.

By using the reflected power as a basis for determining whether the matching is performed, the reflected power can be ensured to reduce as much as possible, thereby effectively reducing a power consumption of the RF power supply and improving the matching efficiency and application window.

In some embodiments, in each pulse period (e.g., within the range from the first pulse period to the M-th pulse period), in the above S110, n<N, that is, only the first n pulse phases may be used as the frequency scanning stage for performing the above-mentioned frequency scanning matching, and subsequent pulse phases (i.e., from an (n+1)-th pulse phase to an N-th pulse phase) can be matched by a conventional matching method to match the output impedance of the RF power supply with the load impedance. Of course, in some embodiments, n=N can also be set, that is, each pulse phase is used as the frequency scanning stage to perform the above-mentioned frequency scanning matching.

It should be appreciated that in the same pulse period, the frequency scanning frequency matching between different pulse phases is independent of each other. For example, suppose each pulse cycle includes two pulse phases, that is, N=2, and they are called the first pulse phase and the second pulse phase; and both pulse phases perform the above frequency scanning frequency matching. In this case, in the first m pulse periods, the matching process of each first pulse phase and the matching process of each second pulse phase are independent of each other, and the two pulse phases are matched individually.

In light of the above, in the method for RF impedance matching provided by the present disclosure, in the first m pulse periods, by setting the start value of the frequency scanning parameter of each frequency scanning stage of the (i+1)-th pulse period to be consistent with the end value of the frequency scanning parameter of each frequency scanning stage of the i-th pulse period, it may not be necessary to re-modulate the frequency in each frequency scanning stage, such that matching can be implemented without using an excessively high frequency scanning speed, thereby avoiding instability problems such as overmodulation. At the same time, it can also effectively reduce the reflected power of the RF power supply, so that the RF power output by the RF power supply can be loaded on the load (for example, the RF coil) as much as possible, thereby reducing the power consumption of the RF power supply and improving the matching efficiency and application window.

Below, the method for RF impedance matching provided by the present disclosure will be described in detail in two embodiments.

Figure 5:
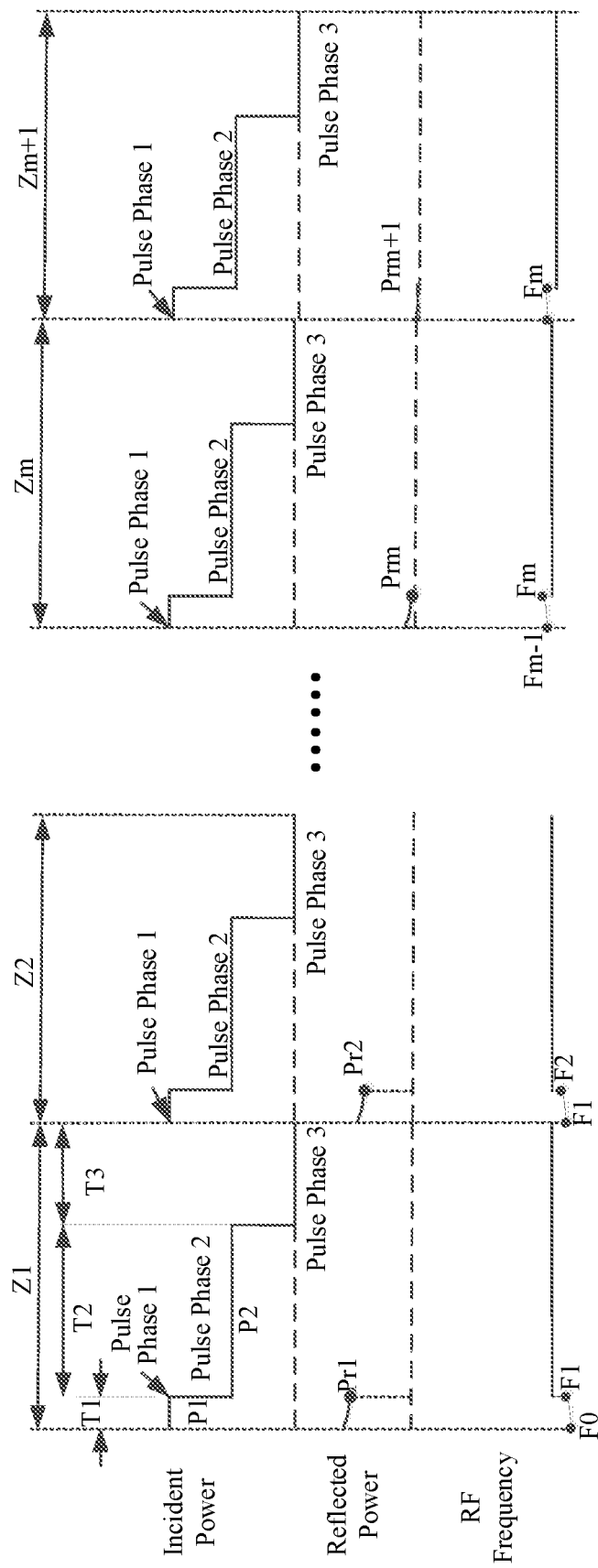
FIG. 5 is a schematic diagram of periodic frequency scanning matching of the method for RF impedance matching according to an embodiment of the present disclosure.

In some embodiments, as shown in FIG. 5, the method for radio frequency impedance matching provided in this embodiment uses an RF impedance matching device of an inductively coupled plasma (ICP) device for matching. A center frequency of the RF can be 13.56 MHz, and the power frequency of the RF can be adjusted within a range of 13.56±5% MHz. The RF includes M pulse periods, including the first pulse period $Z_1$, the second pulse period $Z_2$, . . . , the m-th pulse period $Z_m$, the (m+1)-th pulse period $Z_{m+1}$, . . . , an (M−1)-th pulse period $Z_{M-1}$, and the M-th pulse period $Z_M$. Each pulse period may be divided into N pulse phases, N=3, and may be respectively the first pulse phase 1 (e.g., time $T_1$), the second pulse phase 2 (e.g., time $T_2$) and the third pulse phase 3 (e.g., time $T_3$). The corresponding RF loading powers of the first pulse phase 1, the second pulse phase 2 and the third pulse phase 3 may be $P_1$, $P_2$, and 0, respectively.

In some embodiments, the first pulse phase 1 may be used as the frequency scanning stage, and the matching scheme may be carried out by matching method of the above-mentioned S110. The end value of the frequency scanning parameter may be the frequency for frequency scanning. The second pulse phase 2 and the third pulse phase 3 may both implement the conventional matching scheme, which will not be repeated here.

Specifically, as shown in FIG. 5, in the first pulse period $Z_1$, the first pulse phase 1 implements an initial frequency, $F_0$, of the scanning frequency of the RF power supply to start the frequency scanning to reduce the reflected power and ends with an end frequency, F1, of the frequency scanning. At this time, the reflected power is $P_{r1}$, which does not meet the requirement for the target value of the frequency scanning parameter.

In the second pulse period $Z_2$, the first pulse phase 1 implements an end frequency, $F_1$, of frequency scanning of the first pulse period $Z_1$ to start the frequency scanning and ends with the end frequency, F2, of the frequency scanning. At this time, the reflected power is $P_{r2}$, which still does not meet the requirement for the target value of the frequency scanning parameter.

By analogy, until the m-th pulse period $Z_m$, the first pulse phase 1 starts the frequency scanning with the end frequency, $F_{m-1}$, of the frequency scanning of an (m−1)-th pulse period $Z_{m-1}$, and ends with the end frequency, $F_m$, of the frequency scanning. At this time, the reflected power is $P_{rm}$, which meets the requirement for the target value of the frequency scanning parameter, that is, the output impedance of the RF power supply matches the load impedance.

Starting from the (m+1)-th pulse period $Z_{m+1}$, for each subsequent pulse period, the RF implemented in the first pulse phase 1 remains unchanged and is consistent with the end frequency, $F_m$, of the frequency scanning of the m-th pulse period $Z_m$. Thus, it can be ensured that the reflected power $P_{rm+1}$ meets the requirement for the target value of the frequency scanning parameter.

In some embodiments, starting from the (m+1)-th pulse period $Z_{m+1}$, and any subsequent pulse period, if the RF does not meet the requirement for the target value of the frequency scanning parameter, the RF power supply can restart the frequency scanning with an end frequency, $F_m$, of the frequency scanning of the m-th pulse period, $Z_m$, as a start point of the frequency scanning, until after the m' pulse periods, $Z_{m'}$, the first pulse phase 1 finally makes the reflected power meet the requirement for matching the target value of the frequency scanning parameter through the frequency scanning.

Figure 6:
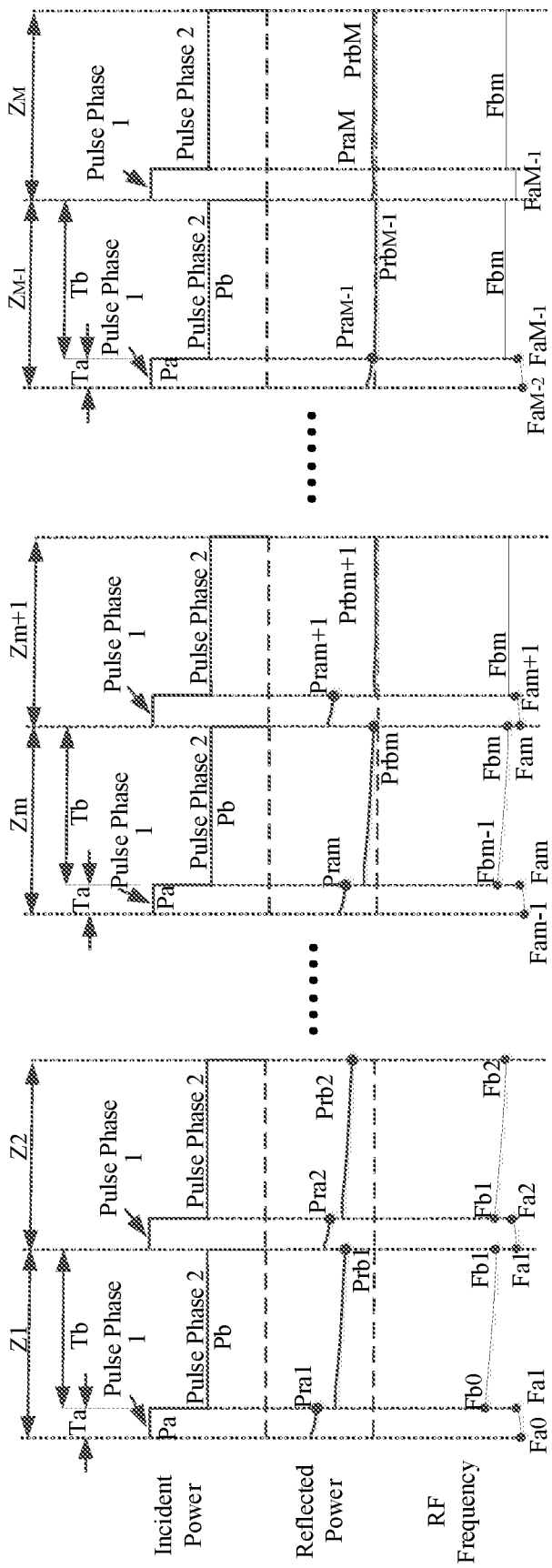
FIG. 6 is a schematic diagram of the periodic frequency scanning matching of the method for RF impedance matching according to an embodiment of the present disclosure.

In some embodiments, as shown in FIG. 6, in the method for RF impedance matching provided by an embodiment uses a RF impedance matching device of a capacitively coupled plasma (CCP) device for matching. The center frequency of the radio frequency is 60 MHz, and the frequency of the RF power supply can be adjusted within the range of 60±10% MHz. The RF includes M pulse periods, including the first pulse period $Z_1$, the second pulse period $Z_2$, . . . , the m-th pulse period $Z_m$, the (m+1)-th pulse period $Z_{m+1}$, . . . , the (M−1)-th pulse period $Z_{M-1}$, and the M-th pulse period $Z_M$. Each pulse period can be divided into N pulse phases, N=2, and they are the first pulse phase 1 (e.g., time $T_a$) and the second pulse phase 2 (e.g., time $T_b$), respectively. The RF loading power corresponding to the first pulse phase 1 and the second pulse phase 2 are $P_a$ and $P_b$, respectively.

In some embodiments, the first pulse phase 1 and the second pulse phase 2 can be both used as frequency scanning stages, and the matching scheme of theirs can both implement the matching method of the above-mentioned S110. The frequency scanning process of the first pulse phase 1 and that of the second pulse phase 2 are independent from each other.

Specifically, as shown in FIG. 6, in the first pulse period $Z_1$, the first pulse phase 1 implements an initial frequency, $F_{a0}$, of the frequency scanning of the RF power supply to start the frequency scanning to reduce the reflected power and ends with an end frequency, Fai, of the frequency scanning. At this time the reflected power is $P_{ra1}$, which does not meet the requirement for the target value of the frequency scanning parameter of the first pulse phase 1. The second pulse phase 2 implements an initial frequency, $F_{b0}$, of the frequency scanning of the RF power supply to start the frequency scanning and ends with an end frequency, $F_{b1}$, of the frequency scanning. At this time, the reflected power is $P_{rb1}$, which does not meet requirement for the target value of the frequency scanning parameter of the second pulse phase 2.

In the second pulse period $Z_2$, the first pulse phase 1 implements an end frequency $F_{a1}$ of the frequency scanning of the first pulse phase 1 of the first pulse period $Z_1$ to start the frequency scanning, and ends with an end frequency $F_{a2}$ of the frequency scanning of the first pulse phase 1. At this time, the reflected power is $P_{ra2}$, which still does not meet the requirement for the target value of the frequency scanning parameter of the first pulse phase 1. The second pulse phase 2 implements the end frequency $F_{b1}$ of the frequency scanning of the second pulse phase 2 of the first pulse period $Z_1$ and ends with an end frequency scanning frequency $F_{b2}$ of the second pulse phase 2. At this time, the reflected power is $P_{rb2}$, which does not meet the requirement for the target value of the frequency scanning parameter of the second pulse phase 2.

By analogy, until the m-th pulse period $Z_m$, the first pulse phase 1 implements an end frequency, $F_{am-1}$, of the frequency scanning of the first pulse phase 1 of the (m−1)-th pulse period, $Z_{m-1}$, to start the frequency scanning and ends with an end frequency $F_{am}$ of the frequency scanning. At this time, the reflected power is $P_{ram}$, which still does not meet the requirement for the target value of the frequency scanning parameter of the first pulse phase 1. The second pulse phase implements an end frequency Fbm−1 of the frequency scanning of the second pulse phase 2 of the (m−1)-th pulse period, $Z_{m-1}$, and ends with an end frequency $F_{bm}$ of the frequency scanning. At this time, the reflected power is $P_{rbm}$, which meets the requirement for the target value of the frequency scanning parameter of the second pulse phase 2, that is, the output impedance of the RF power supply of the second pulse phase 2 matches with the load impedance.

For the second pulse phase 2, starting from the (m+1)-th pulse period, $Z_{m+1}$, the RF implemented in the second pulse period 2 of each subsequent pulse period remains unchanged and is consistent with the end frequency $F_{bm}$ of the frequency scanning of the second pulse phase 2 of the m-th pulse period $Z_m$, thereby ensuring that the reflected power $P_{rbm+1}$ meets the requirement for the target value of the frequency scanning parameter.

For the first pulse phase 1, in the (m+1)-th pulse period, $Z_{m+1}$, the first pulse phase 1 implements the end frequency Fam of the frequency scanning of the first pulse phase 1 of the m-th pulse period, $Z_m$, to start the frequency scanning, and ends with the end frequency, $F_{am+1}$, of the frequency scanning. At this time, the reflected power is $P_{ram+1}$, which still does not meet the requirement for the target value of the frequency scanning parameter of the first pulse phase 1.

By analogy, in the (M−1)-th pulse period, $Z_{M-1}$, the first pulse phase 1 implements an end frequency $F_{aM-2}$ of the frequency scanning of the first pulse phase 1 of the (M−2)-th pulse period, $Z_{M-2}$, to start the frequency scanning and ends with an end frequency, $F_{aM+1}$, of the frequency scanning. At this time, the reflected power is $P_{raM-1}$, which meets the requirement for the target value of the frequency scanning parameter of the first pulse phase 1. Starting from the M-th pulse period, ZM, for each subsequent pulse period, the RF implemented in the first pulse phase 1 remains unchanged and is consistent with the end frequency, $F_{aM-1}$, of the frequency scanning of the (M−1)-th pulse period, $Z_{M-1}$, thereby ensuring that the reflected power $P_{raM}$ meets the requirement for the target value of the frequency scanning parameter.

In some embodiments, whether it is in the first pulse phase 1 or the second pulse phase 2, after the pulse period where the RF frequency remains unchanged, when one or both of them does not meet the matching accuracy, the following method may be implemented for re-adjustment. For example, in the second pulse phase 2, the RF power supply can implement the end frequency, $F_{bm}$, of the frequency scanning of the second pulse phase 2 of the m-th pulse period, $Z_m$, as the starting point of the frequency scanning, to restart the frequency scanning until after the second pulse phase 2 of the m' pulse periods, $Z_{m'}$, to finally make the reflected power meet the requirement for matching the target value of the frequency scanning parameter by frequency scanning.

Figure 7:
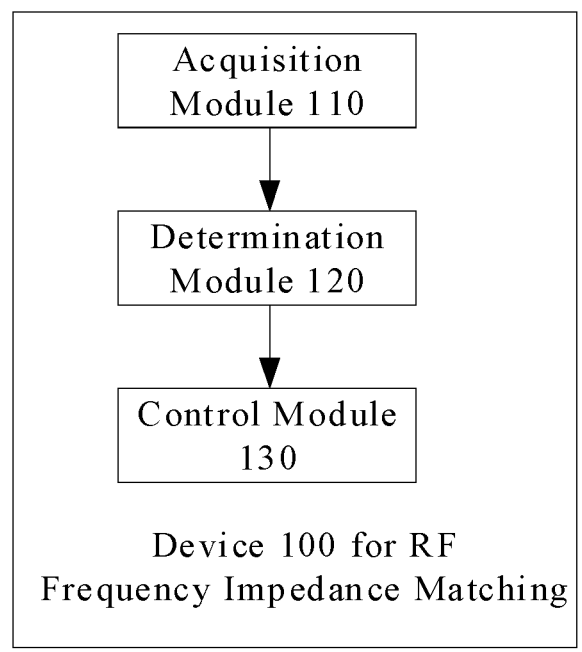
FIG. 7 is a schematic structural diagram of a device for RF impedance matching according to an embodiment of the present disclosure.

The second aspect of the present disclosure, as shown in FIG. 7, provides a device 100 for RF impedance matching, which implements the method for RF impedance matching as described above.

In some embodiments, in the device 100 for RF impedance matching, in the first m pulse periods, by setting the start value of the frequency scanning parameter of each frequency scanning stage of the (i+1)-th pulse period to be consistent with the end value of the frequency scanning parameter of each frequency scanning stage of the i-th pulse period, it may not be necessary to re-modulate the frequency in each frequency scanning stage, such that the matching can be implemented without using an excessively high frequency scanning speed, so that the instability problems such as overmodulation can be avoided. At the same time, it can also effectively reduce the reflected power of the RF power supply, so that the RF power output by the RF power supply can be loaded on the load (for example, the RF coil) as much as possible, thereby reducing the power consumption of the RF power supply and improving the matching efficiency and application window.

In some embodiments, as shown in FIG. 7, the device 100 for RF impedance matching includes an acquisition module 110, a determination module 120, and a control module 130. The control module 130 is configured to perform frequency scanning matching for each frequency scanning stage of the i-th pulse period and send a control signal to the acquisition module 110 after the matching is completed. The acquisition module 110 is configured to: when receiving the control signal, acquire a end value of a frequency scanning parameter of each frequency scanning stage of the i-th pulse period, and send the end value of the frequency scanning parameter to the determination module 120. The determination module 120 is configured to: determine whether the end value of the frequency scanning parameter of each frequency scanning stage of the i-th pulse period matches the target value of the frequency scanning parameter; if there is a match, sending a matching signal to the control module 130; if there is no match, sending an unmatching signal to the control module 130.

The control module 130 further configured to: when receiving the unmatching signal, set i=i+1, and perform frequency scanning matching for each frequency scanning stage of the i-th pulse period, and send a control signal to the acquisition module after the matching is completed. The start value of the frequency scanning parameter of each frequency scanning stage of the (i+1)-th pulse period is consistent with the end value of the frequency scanning parameter of each frequency scanning stage of the i-th pulse period.

When the matching signal is received, from the (m+1)-th pulse period to the M-th pulse period, the frequency scanning parameter of the pulse phase corresponding to each frequency scanning stage of each pulse period remains unchanged and is consistent with the end value of the frequency scanning parameter of each frequency scanning stage of the m-th pulse period.

In a third aspect of the present disclosure, a semiconductor processing apparatus is provided, including the device for RF impedance matching described above.

In some embodiments, the semiconductor processing apparatus includes the foregoing described device for RF impedance matching. The apparatus can implement the foregoing described method for RF impedance matching. Therefore, matching can be implemented without using an excessively high frequency scanning speed, thereby avoiding instability problems such as overmodulation. At the same time, it can also effectively reduce the reflected power of the RF power supply, so that the RF power output by the RF power supply can be loaded on the load (for example, the RF coil) as much as possible, thereby reducing the power consumption of the RF power supply and improving the matching efficiency and application window.

One or more of the acquisition module, the determination module and the control module according to the embodiments of the present disclosure, or at least partial functions of any number of them may be implemented in one or more modules or units. Any one or more of the above modules or units may be at least partially implemented as a hardware circuit, such as field-programmable gate array (FPGA), programmable logic array (PLA), system-on-chip, system on the substrate, system on the package, application-specific integrated circuit (ASIC), or can be implemented through hardware or software in any other reasonable manner that integrates or packages the circuit, or in any one or a suitable combination of any group of the implementations of software and/or hardware components. Alternatively, one or more of the above-mentioned modules according to the embodiments of the present disclosure may be implemented as one or more computer programs stored in computer-readable medium, and when the computer programs are executed by one or more processors, the function of a corresponding module may be performed.

A person skilled in the art would recognize, however, that the embodiments of the present disclosure may also be implemented as one or more computer program product disposed upon a computer-readable storage medium having computer-readable program instructions for causing the device for RF impedance matching to carry out the foregoing described method.

The computer-readable storage medium can be a tangible storage device for storing instructions. The computer-readable storage medium includes flash drives, movable hard disks, read-only memories (ROM), random-access memories (RAM), magnetic disks or optical disks, and other mediums that can store program codes.

Computer-readable program instructions for carrying out the method in embodiments of the present disclosure may be assembler instructions, instruction-set architecture (ISA) instructions, machine instructions, machine dependent instructions, microcode, firmware instructions, state-setting data, or other source code or object code written in any combination of one or more programming languages.

It can be appreciated that the above implementations are merely exemplary implementations used to illustrate the principle of the disclosure, but the disclosure is not limited thereto. For those of ordinary skill in the art, various modifications and improvements can be made without departing from the spirit and essence of the disclosure, and these modifications and improvements are also considered within the scope of the disclosure.

What is claimed is:

1. A method for radio frequency (RF) impedance matching for a radio frequency including M pulse periods, each of the M pulse periods including N pulse phases, M and N being integers greater than 1, wherein the method comprises:

performing frequency scanning matching by using first n pulse phases of each of first m pulse periods as frequency scanning stages each corresponding to one of the first m pulse periods, a start value of a frequency scanning parameter of the frequency scanning stage of an (i+1)-th pulse period being consistent with an end value of the frequency scanning parameter of the frequency scanning stage of an i-th pulse period to make an end value of the frequency scanning parameter of the frequency scanning stage of an m-th pulse period to match a target value of the frequency scanning parameter, m and n being integers greater than 0, m<M, n≤N, and i=1, 2, . . . , m; and maintaining the frequency scanning parameter of pulse phases, corresponding to the first n pulse phases, of each pulse period from an (m+1)-th pulse period to an M-th pulse period to be unchanged, the frequency scanning parameter of the pulse phases of each pulse period from the (m+1)-th pulse period to the M-th pulse period being consistent with the end value of the frequency scanning parameter of the frequency scanning stage of the m-th pulse period.

2. The method according to claim 1, further comprising:

performing the frequency scanning matching on the frequency scanning stage of the i-th pulse period;

obtaining the end value of the frequency scanning parameter of the frequency scanning stage of the i-th pulse period;

determining whether the end value of the frequency scanning parameter of the frequency scanning stage of the i-th pulse period matches the target value of the frequency scanning parameter;

in response to the end value of the frequency scanning parameter of the frequency scanning stage of the i-th pulse period matching the target value of the frequency scanning parameter, maintaining the frequency scanning parameter of the pulse phases, corresponding to the first n pulse phases, of each pulse period from the (m+1)-th pulse period to the M-th pulse period to be unchanged; and in response to the end value of the frequency scanning parameter of the frequency scanning stage of the i-th pulse period not matching the target value of the frequency scanning parameter, performing the frequency scanning matching on the frequency scanning stage of the (i+1)-th pulse period, the start value of the frequency scanning parameter of the frequency scanning stage of the (i+1)-th pulse period being consistent with the end value of the frequency scanning parameter of the frequency scanning stage of the i-th pulse period.

3. The method according to claim 1, further comprising:

maintaining the frequency scanning parameter of the pulse phases, corresponding to the first n pulse phases, of an (m+j)-th pulse period to be unchanged, the frequency scanning parameter of the pulse phases of the (m+j)-th pulse period being consistent with the frequency scanning parameter of the frequency scanning stage of the m-th pulse period, j=1, 2, . . . , M-m-1;

acquiring an end value of the frequency scanning parameter of the frequency scanning stage of the (m+j)-th pulse period;

determining whether the end value of the frequency scanning parameter of the frequency scanning stage of the (m+j)-th pulse period matches the target value of the frequency scanning parameter;

in response to the end value of the frequency scanning parameter of the frequency scanning stage of the (m+j)-th pulse period matching the target value of the frequency scanning parameter, maintaining the frequency scanning parameter of pulse phases, corresponding to the first n pulse phases, of an (m+j+1)-th pulse period to be unchanged, the frequency scanning parameter of the pulse phases of the (m+j+1)-th pulse period being consistent with the frequency scanning parameter of the frequency scanning stage of the m-th pulse period, j=1, 2, . . . , M−m−1; and the frequency scanning stages are first frequency scanning stages, and in response to the end value of the frequency scanning parameter of the frequency scanning stage of the (m+j)-th pulse period not matching the target value of the frequency scanning parameter, performing the frequency scanning matching by using first n pulse phases of k pulse periods following the (m+j)-th pulse period as second frequency scanning stages each corresponding to one of the k pulse periods, a start value of the frequency scanning parameter of the second frequency scanning stage of the (m+j+1)-th pulse period being consistent with an end value of the frequency scanning parameter of the second frequency scanning stage of the (m+j)-th pulse period to make an end value of the frequency scanning parameter of the second frequency scanning stage of an (m+j+k)-th pulse period to match the target value of the frequency scanning parameter, m and n being integers greater than 0, m<M, n≤N, and j+k=1, 2, . . . , M−m−1.

4. The method according to claim 2, further comprising:

acquiring a reflected power of a radio frequency power supply after the frequency scanning stage of the i-th pulse period;

determining whether the reflected power matches a predetermined reflected power;

in response to the reflected power matching the predetermined reflected power, determining that the end value of the frequency scanning parameter of the frequency scanning stage of the i-th pulse period matches the target value of the frequency scanning parameter; and in response to the reflected power not matching the predetermined reflected power, determining that the end value of the frequency scanning parameter of the frequency scanning stage of the i-th pulse period does not match the target value of the frequency scanning parameter.

5. The method according to claim 1, further comprising:
in each pulse period, for pulse phases from an (n+1)-th pulse phase to an N-th pulse phase, performing matching by using frequency scanning to each of the pulse pulses or adjusting a capacitance of a matching device to make an output impedance of a RF power supply to match a load impedance, n<N.

6. The method according to claim 1, wherein: N=3; n=1.

7. The method according to claim 1, wherein: N=2; n=2.

8. The method according to claim 1, wherein the frequency scanning parameter comprises at least one of: a frequency of the frequency scanning, a frequency scanning range, a frequency scanning speed, a frequency scanning accuracy, or a frequency scanning gain.

9. A device for radio frequency (RF) impedance matching for a radio frequency including M pulse periods, each of the M pulse periods including N pulse phases, M and N being integers greater than 1, the device comprising one or more processors, individually or collectively, configured:
using first n pulse phases of each of first m pulse periods as frequency scanning stages each corresponding to one of the first m pulse periods to perform frequency scanning matching, a start value of a frequency scanning parameter of the frequency scanning stage of an (i+1)-th pulse period being consistent with an end value of the frequency scanning parameter of the frequency scanning stage of an i-th pulse period to make an end value of the frequency scanning parameter of the frequency scanning stage of an m-th pulse period to match a target value of the frequency scanning parameter, m and n being integers greater than 0, m<M, n≤N, and i=1, 2, . . . , m; and
maintaining the frequency scanning parameter of pulse phases, corresponding to the first n pulse phases, of each pulse period from an (m+1)-th pulse period to an M-th pulse period to be unchanged, the frequency scanning parameter of the pulse phases of each pulse period from the (m+1)-th pulse period to the M-th pulse period being consistent with the end value of the frequency scanning parameter of the frequency scanning stage of the m-th pulse period.

10. The device according to claim 9, wherein the one or more processors are further configured for:
performing the frequency scanning matching on the frequency scanning stage of the i-th pulse period;
obtaining the end value of the frequency scanning parameter of the frequency scanning stage of the i-th pulse period;
determining whether the end value of the frequency scanning parameter of the frequency scanning stage of the i-th pulse period matches the target value of the frequency scanning parameter;
in response to the end value of the frequency scanning parameter of the frequency scanning stage of the i-th pulse period matching the target value of the frequency scanning parameter, maintaining the frequency scanning parameter of the pulse pulses, corresponding to the first n pulse phases, of each pulse period from the (m+1)-th pulse period to the M-th pulse period to be unchanged; and
in response to the end value of the frequency scanning parameter of the frequency scanning stage of the i-th pulse period not matching the target value of the frequency scanning parameter, and performing the frequency scanning matching on the frequency scanning stage of the (i+1)-th pulse period, the start value of the frequency scanning parameter of the frequency scanning stage of the (i+1)-th pulse period being consistent with the end value of the frequency scanning parameter of the frequency scanning stage of the i-th pulse period.

11. A semiconductor processing apparatus, comprising a device for radio frequency (RF) impedance matching for a radio frequency including M pulse periods, each of the M pulse periods including N pulse phases, M and N being integers greater than 1, the device comprising one or more processors, individually or collectively, configured for:
using first n pulse phases of each of first m pulse periods as frequency scanning stages each corresponding to one of the first m pulse periods to perform frequency scanning matching, a start value of a frequency scanning parameter of the frequency scanning stage of an (i+1)-th pulse period being consistent with an end value of the frequency scanning parameter of the frequency scanning stage of an i-th pulse period to make an end value of the frequency scanning parameter of the frequency scanning stage of an m-th pulse period to match a target value of the frequency scanning parameter, m and n being integers greater than 0, m<M, n≤N, and i=1, 2, . . . , m; and
maintaining the frequency scanning parameter of a pulse phase pulse phases, corresponding to the first n pulse phase, of each pulse period from an (m+1)-th pulse period to an M-th pulse period to be unchanged, the frequency scanning parameter of the pulse phases of each pulse period from the (m+1)-th pulse period to the M-th pulse period being consistent with the end value of the frequency scanning parameter of the frequency scanning stage of the m-th pulse period.

* * * * *